(12) United States Patent
Takehara

(10) Patent No.: US 6,894,629 B2
(45) Date of Patent: May 17, 2005

(54) RESOLVER/DIGITAL CONVERTER

(75) Inventor: Takao Takehara, Tokyo (JP)

(73) Assignee: Minebea Co., Ltd., Nagano-ken (JP)

( * ) Notice: Subject to any disclaimer, the term of this patent is extended or adjusted under 35 U.S.C. 154(b) by 0 days.

(21) Appl. No.: 10/792,650

(22) Filed: Mar. 4, 2004

(65) Prior Publication Data

US 2004/0233079 A1 Nov. 25, 2004

(30) Foreign Application Priority Data

Apr. 1, 2003 (JP) .................................. 2003-098349

(51) Int. Cl.[7] .............................................. H03M 1/48
(52) U.S. Cl. ....................................... 341/116; 341/117
(58) Field of Search ................................ 341/116, 117, 341/111, 112, 115, 113, 110, 118

(56) References Cited

U.S. PATENT DOCUMENTS

| | | | | |
|---|---|---|---|---|
| 6,018,318 A | * | 1/2000 | Schodlbauer | 342/442 |
| 6,323,790 B1 | * | 11/2001 | Takehara | 341/111 |
| 6,389,373 B1 | * | 5/2002 | Ohya | 702/189 |

FOREIGN PATENT DOCUMENTS

| | | |
|---|---|---|
| DE | 19548385 A1 | 7/1997 |
| EP | 0978947 A2 | 2/2000 |
| JP | A-62-38302 | 2/1987 |
| JP | A-4-183021 | 6/1992 |

OTHER PUBLICATIONS

Domrachev V. G. et al., "Digital Encoders of Sine-Cosine Rotating Transformers Output Signals," *Measurement Techniques*, Consultants Bureau, New York, vol. 30, No. 11, Nov. 1, 1987 pp. 1083–1088, XP000001285.

* cited by examiner

*Primary Examiner*—Jean Jeanglaude
*Assistant Examiner*—John B Nguyen
(74) *Attorney, Agent, or Firm*—Adduci, Mastriani & Schaumberg, L.L.P.

(57) ABSTRACT

An A/D converter converts a sine and cosine wave output of a resolver to form a digital sine and cosine. A microcomputer uses an absolute value of digital sin θ as an address to retrieve θ from a memory containing angle values between 0° and 90°, if the absolute value of sin θ is between 0 and 0.707. Otherwise, if the absolute value of sin θ is between 0.707 and 1, cos θ is used as an address to retrieve θ. The polarities of sin θ and cos θ are used to determine a quadrant and an associated offset including 0°, 180°−θ, 180°+θ, and 360°−θ, which is combined with θ such that the final angle of the rotor axis is obtained.

18 Claims, 3 Drawing Sheets

RESOLVER/DIGITAL CONVERTER

CROSS REFERENCE TO RELATED APPLICATION

This application is based on and incorporates by reference Japanese Patent Application No. 2003-098349 filed on Apr. 1, 2003.

BACKGROUND OF THE INVENTION

The present invention relates to digital converters, and more particularly, to a converter for digitizing the rotational output of a resolver.

A resolver is a type of rotary transformer typically having two stator windings and one rotor winding on an axis or shaft. A resolver is used for determining the position of the shaft or axis of the rotor, with respect to a reference point, within a space of one complete revolution of the shaft or a corresponding angular displacement within an angle space from 0° to 360°. The two stator windings are mechanically arranged such that their physical relation is shifted by a 90° angle. The physical spacing of the stator windings gives rise to a mathematical/electrical relation in that any signals induced in the stator windings from, for example, a rotor excitation signal, will be correspondingly shifted by 90° leading to the sine and cosine function relations assigned to the respective outputs of the stator windings. It will be appreciated that the degree of accuracy of the 90° physical relation based on, for example, accurate placement of stator windings, will affect the degree to which the outputs are electrically shifted by 90° and thus accurately represent a sine and a cosine relation respectively. It is understood by those of ordinary skill in the art that the sine and cosine functions are mathematically characterized by a 90° shift therebetween.

The amplification of a signal obtained by coupling with the stator windings is a function of the position of the resolver rotor axis and the relative position of the stator windings. Therefore, two types of output voltages (S3-S1, S4-S2) are modulated according to a sine wave function and a cosine wave function corresponding to the axis angle of the resolver rotor relative to the stator windings. The output voltage waveforms can be expressed in the following formulae (1) and (2).

$$S3-S1 = A(\sin \omega t)(\sin \theta) \quad (1)$$

$$S4-S2 = A(\sin \omega t)(\cos \theta) \quad (2)$$

where "$\theta$" is the angle of the rotor axis, "$\omega$" is the angular velocity corresponding to the rotor excitation frequency (f), and "A" is the rotor excitation amplification.

Proposals have been set forth for Resolver/Digital (R/D) converters in which, of the continuous output voltage signals S3-S1 and S4-S2, the signal with the smaller absolute value or magnitude is divided by the signal with the larger absolute value and, based on a resulting continuous signal associated with the quotient, the angle data is obtained. An example of such a proposed R/D converter may be seen, for example, in Japanese Unexamined Patent Application Publication S62-38302. Therein, $\tan \theta$ and $\cot \theta$ are calculated from output voltages S3-S4, S4-S2. At the same time, a digital code, or the like, for $A(\sin \omega t)$ is determined from the output voltage S3-S1, the digital code result such as an index or the like, and the angle section of the resolver rotor axis obtained from the digital code result or index. As noted, one of either $\tan \theta$ or $\cot \theta$ maybe used as a digital code, and angle data associated with resolver rotor axis angle $\theta$ and corresponding to the digital code or index and stored in advance in the table converter, is read and output.

Problems arise however, since the proposed R/D converter mentioned above requires angle data, in a range of 0° to 360° corresponding to the digital codes or indexes determined from output voltages, to be stored in the table converter. When high precision is required, memory capacity must be increased since a greater number of angle data values must be stored. In addition, the continuous calculation of quotients, namely $\tan \theta$ and $\cot \theta$, with a microcomputer involves a long calculation time, thereby making it less desirable or effective in an operational environment where quantities associated with a high rate of rotation of the resolver rotor axis are present.

SUMMARY OF THE INVENTION

Accordingly, an object of the invention is to provide an R/D converter allowing high precision detection of the rotation angle of a resolver rotor axis.

Another object of the invention is to provide an R/D converter capable of working effectively in operational environments where a high rate of rotation of the resolver rotor axis is typical.

Thus the R/D converter of the present invention finds an angle of a rotor axis of a resolver based on a sine wave output and cosine wave output of the resolver. The exemplary R/D converter includes: an A/D converter configured to convert the sine wave output and cosine wave output of the resolver into, for example, a digitized sine wave output and digitized cosine wave output; an angle data memory maintaining predetermined angle data in a range of 0° to 90°; an address converter configured to convert either a digitized sine wave value or a digitized cosine wave value to an index or address or a series of indexes and addresses associated with, for example, a storage location in the angle data memory, a series of storage locations in the angle data memory, a base address of the angle data memory, or the like; an angle data reader configured to provide the address, to which the digitized sine wave value or digitized cosine wave value is converted by the address converter, to the angle data memory, and read the angle data corresponding to the address; a discriminator or the like configured to determine or otherwise make a judgment as to which of four 90° quadrants formed by dividing the angle space from 0° to 360° of the resolver into four, the rotor axis of the resolver belongs based on, for example, the polarity of the sine wave value and cosine wave value from the A/D converter; and a calculator configured to find the final angle of the rotor of the resolver by using the offset value of the angle of the rotor based on the determined quadrant, to create the angle data read by the angle data reader.

In accordance with various exemplary embodiments, the R/D converter of the present invention maintains predetermined angle data in the range of 0° to 90° in the angle data memory. The sine wave output and cosine wave output of the resolver are A/D converted by the A/D converter forming a digitized sine wave output and a digitized cosine wave output. Either the digitized sine wave value or digitized cosine wave value is converted to an address of the angle data memory, the address being provided to the angle data memory by the angle data reader. The angle data corresponding to the sine wave value and cosine wave value is read and, using the discriminator, a determination is made as to which of the four 90° quadrants, formed by equally dividing the complete 0° to 360° angle space of the resolver, the rotor axis of the resolver belongs based on a polarity associated with digitized sine wave value and digitized cosine wave value. An offset value is established based on the determined quadrant and added to or subtracted from the angle data read by the angle data reader to find the final angle. Using the above-described calculator, high precision detection of the rotation angle of the rotor axis is made possible even in operational environments characterized by a high rate of rotation.

In accordance with the present invention, the address converter preferably reads the sine wave value and converts it to an index or address corresponding to an angle data value in the range of 0° to 45°, and reads the cosine wave value and converts it to an index or address corresponding to an angle data value in the range of 45° to 90°. Further, to provide an excitation sine wave for the resolver, sample values of a sine wave, which is sampled at a designated sampling frequency, are stored in a memory within the R/D converter and are preferably accessible by a microcomputer or processor. The values are preferably stored based on addresses automatically generated by, for example, an address generator, and are output from the memory and converted into an analog signal by the D/A converter and output as a sine wave for the excitation of the resolver. In addition, one or more high frequency components are removed by a filter such as a low pass filter or the like which removes noise and associated high frequency components associated with quantizing of the sine wave for excitation during, for example, conversion and output from the D/A converter to the resolver.

BRIEF DESCRIPTION OF THE DRAWINGS

The accompanying figures, in which like reference numerals refer to identical or functionally similar elements throughout the separate views and which, together with the detailed description below, are incorporated in and form part of the specification, serve to further illustrate various embodiments and to explain various principles and advantages all in accordance with the present invention.

DETAILED DESCRIPTION OF THE PREFERRED EMBODIMENTS

Figure 1:
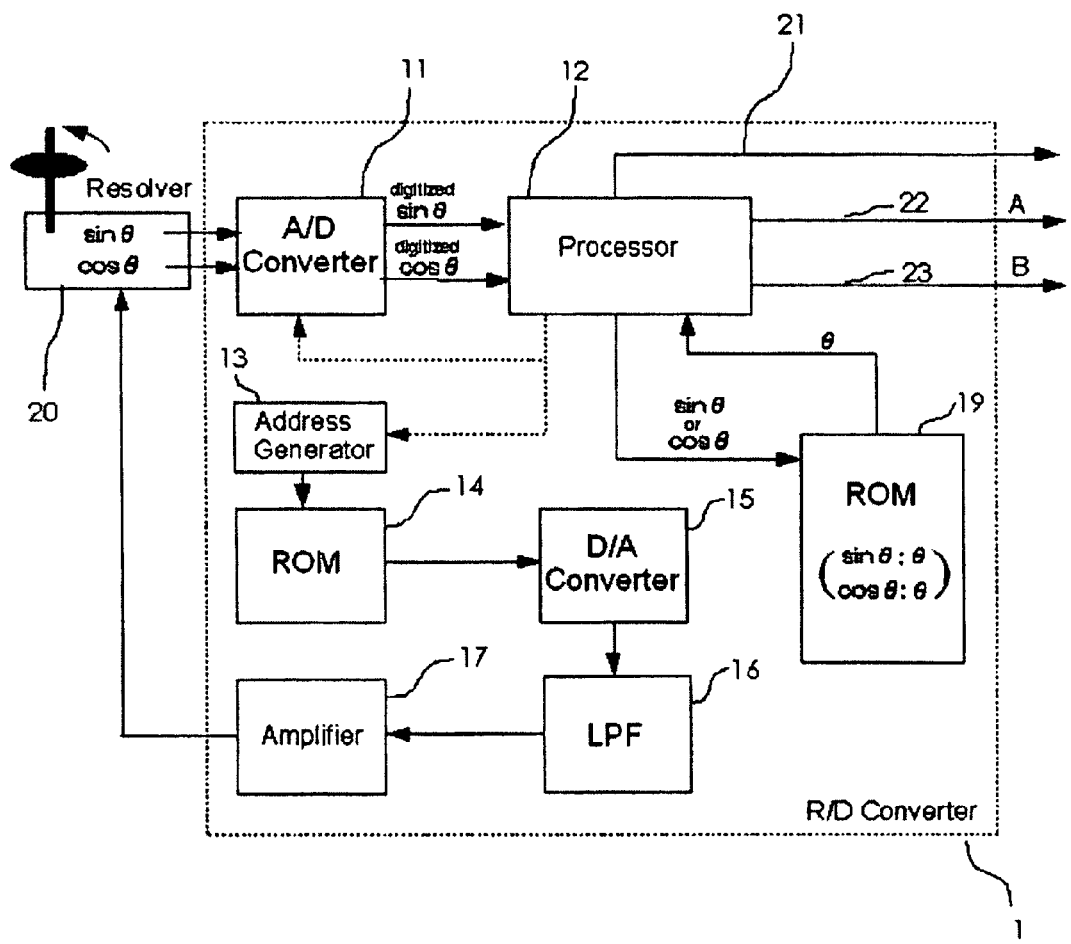
FIG. 1 is a block diagram illustrating structure associated with an exemplary R/D converter according to one embodiment of the present invention.

First, as can be seen by reference to FIG. 1, a block diagram shows the structure of an R/D converter in accordance with an exemplary embodiment of the present invention. R/D converter 1 includes Analog to Digital (A/D) converter 11, processor or microcomputer 12, address generator 13, data ROM 14, digital to analog (D/A) converter 15, low pass filter (LPF) 16, amplifier 17, address generator 18, data ROM 19, and serial port 21.

It should be noted that A/D converter 11 preferably has, for example, a resolution of 10 to 12 bits, and converts the sine wave output and cosine wave output of resolver 20 according to the sampling rate established by microcomputer 12 which supplies an identical sampling clock to A/D converter 11 and address generator 13. Thus, the timing of address generator 13 associated with generating an excitation sine wave to resolver 20, is synchronized with the conversion sampling timing of A/D converter 11. As described above, synchronizing both the generation of the excitation sine wave and conversion sampling allows A/D conversion of the sine wave output and cosine wave output of resolver 20 to occur at a designated phase, and consequently, sin ωt and cos ωt described herein above can be regarded as a constant, and the sine wave output and cosine wave output can be accurately regarded as sine θ and cosine θ.

Microcomputer 12 further generates an address to a location within data ROM 19, as will be described in greater detail hereinafter, from the absolute value of either one of sine θ or cosine θ output from A/D converter 11, and then reads a corresponding θ value from the addressed location in data ROM 19. The θ value is then supplied to serial port 21. In addition, microcomputer 12 generates encoding outputs A 22 and B 23 from θ, which are output and made externally available. Address generator 13 is configured to generate addresses associated with data ROM 14 in accordance with a sampling frequency determined by the sampling clock which may be generated, for example, by microcomputer 12. Values generated from a sine wave sampled at the designated sampling frequency are stored, preferably at successive locations in data ROM 14. In accordance with the addresses provided by address generator 13, stored values are output using, for example, direct memory access (DMA). D/A converter 15 converts the values from data ROM 14 to an analog signal and outputs the signal to a filter, such as low pass filter (LPF) 16, which removes high frequency components generated, for example, during quantizing of the sine wave and further provides a clean signal for excitation for resolver 20. Amplifier 17 amplifies the excitation sine wave from LPF 16, and supplies it to resolver 20.

Figures 2, 3:
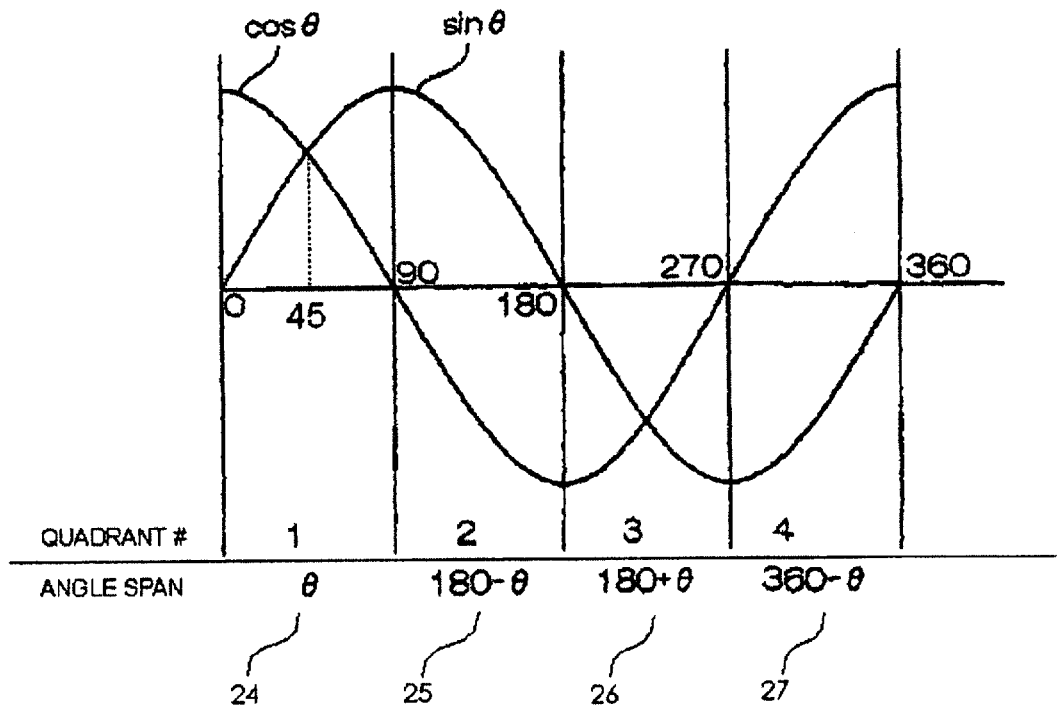
FIG. 2 is a diagram illustrating phase angle and quadrant offsets including first, second, third, and fourth quadrants of an exemplary resolver.
FIG. 3 is a diagram illustrating an exemplary data structure for obtaining the rotor axis angle in accordance with various exemplary embodiments.

As previously noted, data ROM 19 outputs stored angle data corresponding to θ, based on the address generated from the absolute value of the sine θ and the cosine θ by microcomputer 12 as will be now be explained in greater detail. FIG. 2 is a diagram showing a graph of sine θ and cosine θ output, for example, from resolver 20 in analog form, or Analog to Digital (A/D) 11 in digital form, and the corresponding angle θ of the rotor axis. The angle θ of the rotor axis can be, as is apparent from the figure, obtained from a direct calculation of sine θ and/or cosine θ. However, it will be appreciated that the computation process associated with microcomputer 12 calculating sine θ and/or cosine θ is relatively slow compared to, for example, the rate of rotation of the rotor axis. Thus, when the rotor axis of resolver 20 rotates at a high rate of speed, it is difficult to find θ with a direct computation of sine θ or cosine θ. Therefore, in accordance with the present invention, angle data corresponding to θ is stored in the data ROM 19 in advance. By reading the stored angle data corresponding to θ using digitized absolute values of sine θ and cosine θ or the like as addresses into data ROM 19, θ may be easily obtained without conducting a complex and time consuming computation.

Although storing angle data and retrieving it based on converted addresses, for example, as described above, obviates the need for extensive calculations, further improvements may be made. When angle data corresponding to θ is maintained for the entire range of possible angles for the rotor axis, for example, from 0° to 360°, and, in particular, when an increase in resolution is desired in order to attain a high degree of precision, the problem of a corresponding requirement for an increase in memory capacity remains, for example as described above. Therefore, as shown in FIG. 2, angle data θ is maintained for a limited range of possible angles of the rotor axis, for example, from 0° to 90°, thus avoiding the need to increase the memory capacity.

In addition, as θ approaches between 45° and 90°, the maximum value of sine θ, relative changes in the value of sine θ and thus the corresponding ability to detect changes of the angle of the rotor axis become smaller and the resolution naturally decreases. To address this effect, as shown in FIGS. 2 and 3, when the absolute value of sine θ is in the range of 0 to 0.707 corresponding to θ falling within the range of 0° to 45°, the absolute value of the digitized sine θ is used as the address into data ROM 19, and when the absolute value of sine θ is in the range of 0.707 to 1 corresponding to θ falling within the range of 45° to 90°, the absolute value of the digitized cosine θ is used as the address into data ROM 19. A reduction in the resolution which typically occurs near the maximum value of sine θ, for example, between 45° and 90°, can be prevented.

As described above, angle data associated with θ preferably need only be maintained for the range of 0° to 90° in data ROM 19. To obtain an actual or final angle for the rotor axis within the entire range of from 0° to 360° from sine θ and cosine θ, the quadrant of the rotor axis is preferably determined from the polarity of sine θ and cosine θ as follows. Microcomputer 12 finds the current position or current axis angle of the rotor of resolver 20, by checking the polarity of sine θ and cosine θ output of the A/D converter, that is, the digitized outputs of sine θ and cosine θ. By finding the polarity of the digitized sine θ and cosine θ, the quadrant of the rotor axis is determined as would be appreciated by one of ordinary skill in the art and as is evident from a review of, for example, FIG. 2. Therein it can be seen that when cosine θ and sine θ are both positive, θ is within first quadrant 24; when cosine θ is negative and sine θ is positive, θ is in the second quadrant 25; when cosine θ is negative and sine θ is negative, θ is in the third quadrant 26; and when cosine θ is positive and sine θ is negative, θ is in the fourth quadrant 27.

In the present embodiment, as shown in FIG. 2, a 360-degree angle space is divided into four, with 0° to 90° set to be first quadrant 24, 90° to 180° set to be second quadrant 25, 180° to 270° set to be third quadrant 26, and 270° to 360° set to be fourth quadrant 27. An offset is set for each quadrant, and, by adding or subtracting the offset to the angle data read from the data ROM 19 corresponding to θ, microcomputer 12 calculates the final angle of the rotor axis and serial port 21 may then be used to output θ.

Figure 4:
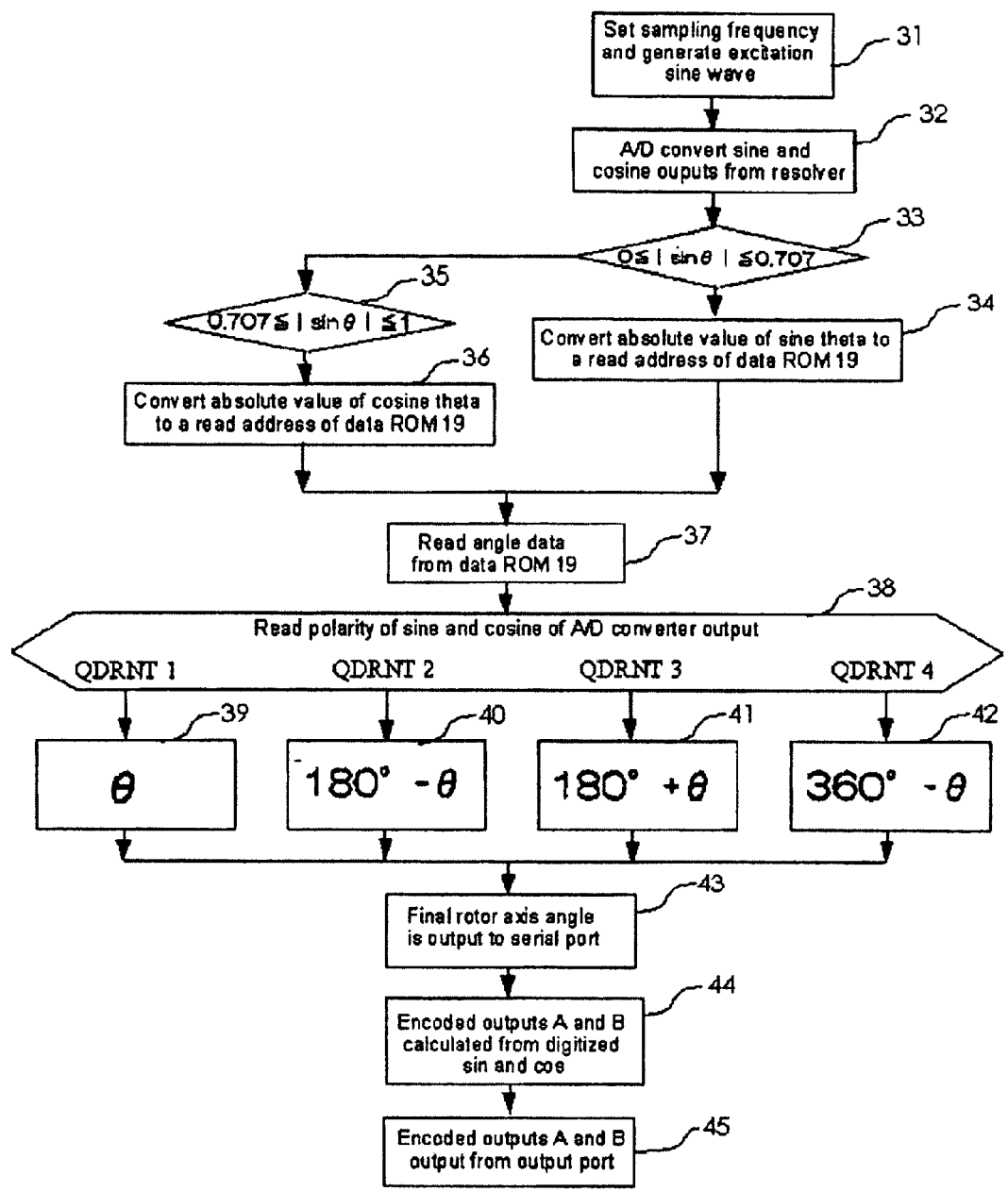
FIG. 4 is a flow chart illustrating the operation of the exemplary R/D converter in accordance with a present embodiment.

Exemplary operation of an R/D converter in accordance with the present invention can be better understood by reference to FIG. 4 wherein a flow chart is shown. First, the sampling frequency (SDFS) of D/A converter 15 is set to be 200 KHz, and an excitation sine wave of 200/20=10 KHz is obtained by cyclically transmitting values stored in data ROM 14 using circular addressing provided by address generator 13, at 31. After initial power-up excitation as described above at 31 is preferably carried out until the excitation state of resolver 20 is stabilized, for example, at the end of a known time interval. The time for initial stabilization may be set in microcomputer 12, or by a timer, or the like, (not shown in the drawing) as would be well known to one of ordinary skill in the art.

Next, at 32, the sine wave output and cosine wave output of resolver 20 are converted, with A/D converter 11, into a digitized sine wave and digitized cosine wave. It should be noted that an identical signal is used as a sampling clock for A/D conversion, for example, as noted above, and for D/A conversion, for example in connection with output of the resolver excitation sine wave. It should further be noted that the sine wave output and cosine wave output of resolver 20 are A/D converted at the same time.

Next, at 33, microcomputer 12 determines whether the absolute value of the digitized value of sine θ, for example as output from the A/D converter 11, is in the range of 0 to 0.707. If so, the digitized value of sine θ is converted to a read address associated with data ROM 19 at 34, and access is made to data ROM 19 at the read address. If the absolute value of the digitized value of sine θ is not in the range of 0 to 0.707, a determination is made whether the absolute value of the digitized value of sine θ is in the range of 0.707 to 1 at 35. If the absolute value of the digitized value of sine θ is in the range of 0.707 to 1, the absolute value of the digitized value of cosine θ is converted to a read address associated with data ROM 19 at 36, and access is made to data ROM 19 at the read address. At 37, angle data corresponding to θ is read from data ROM 19 at the read address. The polarity of the digitized sine θ and cosine θ for example, as output from the A/D converter, is checked, and the quadrant associated with the current position or current axis angle of the rotor of resolver 20 is determined. If the polarity of sine θ and cos θ of the A/D converted output indicates that the current rotor position or axis angle is in first quadrant 24 between 0° to 90°, the offset is zero and the final angle of the rotor axis is set to be θ, the actual angle, at 39.

If the polarity indicates that the current rotor position or axis angle is in second quadrant 25 between 90° to 180°, the value of 180°−θ is set to be the final angle of the rotor axis at 40. If the polarity indicates that the current rotor position or axis angle is in third quadrant 26 between 180° to 270°, the value of 180°+θ is set to be the final angle of the rotor axis at 41. If the polarity indicates that the current rotor position or axis angle is in fourth quadrant 27 between 270° to 360°, the value of 360°−θ is set to be the final angle of the rotor axis at 42. At 43, the final angle of rotation or position of the rotor axis, obtained at 39–42 described above, is output to serial port 21. At 44, encoded outputs A 22 and B 23 are calculated from the sine θ and cosine θ output from A/D converter 11, and at 45, the encoded outputs A 22 and B 23 are output, for example, from the output port or ports of microcomputer 12.

Thus as described above, the present invention provides distinct advantages by maintaining angle data associated with θ in the range of possible angles of the rotor axis of resolver 20 of between 0° to 90°. Accordingly, when resolution is increased, for example, in order to obtain higher degrees of detection precision, an increase in memory capacity in connection with, for example, data ROM 19 is not needed. In addition, because the absolute value of sine θ is used as an address when in the range of 0 to 0.707, and the absolute value of cosine θ is used as an address when the absolute value of sine θ is in the range of 0.707 to 1, the reduction in resolution normally occurring at or near the maximum value of sine θ can be prevented, allowing higher degrees of precision within these angular ranges of θ. Complicated and time consuming calculations are also avoided, and therefore, a microcomputer with average to low computation capability can sufficiently meet the needs associated with obtaining high precision, particularly in operational environments associated with high rates of rotation.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiments were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A resolver/digital (R/D) converter configured to find an angle of a rotor axis of a resolver, said R/D converter comprising:
    a first converter configured to convert a sine wave output and a cosine wave output of said resolver into a digitized sine wave output and a digitized cosine wave output respectively;
    an angle data memory configured to store angle data in the range of 0° to 90° in advance;
    an address converter configured to convert one of the digitized sine wave output and the digitized cosine wave output to an address associated with the angle data memory;
    an angle data reader configured to provide the address to said angle data memory, and read the angle data located in said angle data memory at the provided address;
    a discriminator configured to determine to which one of four quadrants formed by dividing the angle space of said resolver into four, said rotor axis belongs, based on a polarity of the digitized sine wave output and the digitized cosine wave output from said A/D converter; and
    a calculator configured to find a final angle of the rotor axis of said resolver by combining an offset value associated with the angle of the rotor axis, the offset value based on the determined one of the four quadrants, and the angle data read by said angle data reader.

2. An R/D converter in accordance with claim 1, wherein when an absolute value of the digitized sine wave output is greater than or equal to 0 and less than or equal to 0.707, the digitized sine wave output is converted to the address converted by said address converter, and when the absolute value of the digitized sine wave output is greater than 0.707 and less than or equal to 1, the digitized cosine wave output is converted to the address converted by said address converter.

3. An R/D converter in accordance with claim 1, further comprising:
    a memory configured to store a value associated with a sine wave sample based on sampling the sine wave at a designated sampling frequency, and output the stored value based on an automatically generated address; and
    a second converter configured to convert the stored value into an analog signal associated with the sine wave for excitation of said resolver.

4. An R/D converter in accordance with claim 2, further comprising:
    a memory configured to store a value associated with a sine wave sample based on sampling the sine wave at a designated sampling frequency, and outputting the stored value based on an automatically generated address; and
    a second converter configured to convert the stored value into an analog signal associated with the sine wave for excitation of said resolver.

5. An R/D converter in accordance with claim 3, further comprising a filter for removing a high frequency component generated during quantizing of the sine wave for excitation.

6. An R/D converter in accordance with claim 4, further comprising a filter for removing a high frequency component generated during quantizing of the sine wave for excitation.

7. A resolver/digital (R/D) converter configured to find an angle of a rotor axis of a resolver, the R/D converter comprising:
    a processor;
    a first memory configured to store angle data in the range of 0° to 90°; and
    a first converter coupled to the processor and the first memory, the first converter configured to convert a sine wave output and a cosine wave output of the resolver into a digitized sine wave output and digitized cosine wave output respectively,
    wherein the processor is configured to:
        convert one of the digitized sine wave output and the digitized cosine wave output to an address associated with the first memory,
        determine to which one of four quadrants formed by dividing the angle space of the resolver into four, the rotor axis belongs based on respective polarities of the digitized sine wave output and digitized cosine wave output, and
        calculate a final angle of the rotor axis by adding an offset value of the angle of the rotor axis, the offset value based on the determined one of the four quadrants, to the stored angle data read from the first memory.

8. An R/D converter in accordance with claim 7, wherein when an absolute value of the digitized sine wave output is greater than or equal to 0 and less than or equal to 0.707, the digitized sine wave output is converted to the address converted by said processor, and when the absolute value of the digitized sine wave output is greater than 0.707 and less than or equal to 1, the digitized cosine wave output, is converted to the address converted by said processor.

9. An R/D converter in accordance with claim 7, further comprising:
    a second memory configured to store a value associated with a sine wave sampled at a designated sampling frequency; and
    a second converter coupled to the processor, the first memory, the first converter, and the second memory, the second converter configured to convert the stored value into an analog signal value associated with the sine wave for excitation of the resolver,
    wherein the processor is further configured to output the stored value based on an automatically generated address.

10. An R/D converter in accordance with claim 8, further comprising:
    a second memory storing a value associated with a sine wave sampled at a designated sampling frequency; and
    a second converter coupled to the processor, the first memory, the first converter, and the second memory, the second converter configured to convert the stored value into an analog signal value associated with the sine wave for excitation of the resolver, wherein the processor is further configured to output the stored value based on an automatically generated address.

11. An R/D converter in accordance with claim 9, wherein the processor is further configured to remove a high frequency component generated during quantizing the sine wave for excitation.

12. An R/D converter in accordance with claim 10, wherein the processor is further configured to remove a high frequency component generated during quantizing the sine wave for excitation.

13. A resolver/digital (R/D) converter configured to find an angle of a rotor axis of a resolver, the R/D converter comprising:

a processor;

a memory configured to store angle data in the range of 0° to 90°; and a converter coupled to the processor and the first memory, the converter configured to convert a sine wave output and a cosine wave output of the resolver into a digitized sine wave output and digitized cosine wave output respectively, wherein the processor is configured to:
 convert one of the digitized sine wave output and the digitized cosine wave output to an address associated with the first memory,
 determine to which one of four quadrants formed by dividing the angle space of the resolver into four, the rotor axis belongs based on respective polarities of the digitized sine wave output and digitized cosine wave output, and
 calculate a final angle of the rotor axis by adding an offset value of the angle of the rotor axis, the offset value based on the determined one of the four quadrants, to the stored angle data read from the first memory.

14. An R/D converter in accordance with claim 13, wherein when an absolute value of the digitized sine wave output is greater than or equal to 0 and less than or equal to 0.707, the digitized sine wave output is converted to the address converted by said processor, and when the absolute value of the digitized sine wave output is greater than 0.707 and less than or equal to 1, the digitized cosine wave output is converted to the address converted by said processor.

15. An R/D converter in accordance with claim 13, wherein:

the memory is further configured to store a value associated with a sine wave sampled at a designated sampling frequency;

the converter is further configured to convert the stored value into an analog signal value associated with the sine wave for excitation of the resolver; and the processor is further configured to output the stored value based on an automatically generated address.

16. An R/D converter in accordance with claim 14, wherein:

the memory is further configured to store a value associated with a sine wave sampled at a designated sampling frequency;

the converter is further configured to convert the stored value into an analog signal value associated with the sine wave for excitation of the resolver; and the processor is further configured to output the stored value based on an automatically generated address.

17. An R/D converter in accordance with claim 15, wherein the processor is further configured to remove a high frequency component generated during quantizing of the sine wave for excitation.

18. An R/D converter in accordance with claim 16, wherein the processor is further configured to remove a high frequency component generated during quantizing the sine wave for excitation.

* * * * *